(12) United States Patent
McKnight-MacNeil et al.

(10) Patent No.: US 12,166,115 B2
(45) Date of Patent: Dec. 10, 2024

(54) SOLDER RESIST STRUCTURE FOR EMBEDDED DIE PACKAGING OF POWER SEMICONDUCTOR DEVICES

(71) Applicant: Infineon Technologies Canada Inc., Ottawa (CA)

(72) Inventors: Cameron McKnight-MacNeil, Nepean (CA); Ahmad Mizan, Kanata (CA); Maryam Abouie, Ottawa (CA)

(73) Assignee: Infineon Technologies Canada Inc., Ottawa (CA)

( * ) Notice: Subject to any disclaimer, the term of this patent is extended or adjusted under 35 U.S.C. 154(b) by 680 days.

(21) Appl. No.: 17/358,349

(22) Filed: Jun. 25, 2021

(65) Prior Publication Data

US 2022/0416069 A1    Dec. 29, 2022

(51) Int. Cl.
| | |
|---|---|
| *H01L 29/778* | (2006.01) |
| *H01L 23/00* | (2006.01) |
| *H01L 29/20* | (2006.01) |
| *H01L 29/66* | (2006.01) |

(52) U.S. Cl.
CPC ........ *H01L 29/7786* (2013.01); *H01L 23/562* (2013.01); *H01L 29/2003* (2013.01); *H01L 29/66462* (2013.01)

(58) Field of Classification Search
CPC ............... H01L 29/7786; H01L 23/562; H01L 29/2003; H01L 29/66462; H01L 2224/04105; H01L 2224/2518; H01L 23/3677; H01L 23/5389; H01L 23/3107; H01L 24/02–09; H01L 2224/02–09519; H01L 23/488–49894; H01L 23/5228
See application file for complete search history.

(56) References Cited

U.S. PATENT DOCUMENTS

| | | | | |
|---|---|---|---|---|
| 2022/0199449 A1* | 6/2022 | Baker | ................. | H01L 21/6833 |
| 2022/0399305 A1* | 12/2022 | Choi | .................. | H01L 25/0652 |
| 2022/0415806 A1* | 12/2022 | Waidhas | ............. | H01L 23/5384 |

OTHER PUBLICATIONS

GaN Systems Inc. "GaN Systems Extends Market Leadership with Next Generation Automotive-Qualified Transistors", Accesswire; Oct. 20, 2020; 2 pages.

GaN Systems Inc.; Datasheet for "GS-065-060-5-T-A Automotive 650V GaN E-mode transistor"; Rev201001, Oct. 2020; pp. 1-17.

* cited by examiner

*Primary Examiner* — Shahed Ahmed
(74) *Attorney, Agent, or Firm* — WORKMAN NYDEGGER (57) ABSTRACT

Embedded die packaging for high voltage, high temperature operation of power semiconductor devices is disclosed, wherein a power semiconductor die is embedded in package body comprising dielectric layers and electrically conductive layers, and where an external dielectric coating, such as a solder resist coating is provided on one or both external sides of the package body. The solder resist coating is patterned to avoid inside corners, e.g. the solder resist does not extend around or between electrical contact areas and thermal pads. It is observed that in conventional solder resist coatings, during thermal cycling, cracks tend to initiate at high stress points, such as at sharp inside corners. A solder resist layout which omits inside corners, and comprises outside corners only, is demonstrated to provide significantly improved resistance to initiation and propagation of cracks. Where inside corners are unavoidable, they are appropriately radiused to reduce stress.

19 Claims, 6 Drawing Sheets

Location of peak stress is dependent on radius of inside corner

SOLDER RESIST STRUCTURE FOR EMBEDDED DIE PACKAGING OF POWER SEMICONDUCTOR DEVICES

CROSS-REFERENCE TO RELATED APPLICATION(S)

This application is related to U.S. patent application Ser. No. 16/928,305 filed Jul. 14, 2020, entitled "Embedded Die Packaging for Power Semiconductor Devices", which is incorporated herein by reference in its entirety.

TECHNICAL FIELD

This invention relates to embedded die packaging for power semiconductor devices, such as Gallium Nitride (GaN) High Electron Mobility Transistors (HEMTs) for high voltage and high temperature operation.

BACKGROUND

The above referenced U.S. patent application Ser. No. 16/928,305, and references cited therein, provide background information relating to embedded die packaging for power semiconductor devices, such as such as GaN HEMTs, which provide for high current, high voltage operation combined with high switching frequency.

Embedded packaging refers to the type of package in which the power semiconductor die is embedded in a dielectric package body, e.g.: a dielectric polymer resin composition, such as a plastic encapsulation material or a glass fiber epoxy composite, such as FR4 type materials, or a ceramic composite material. Conductive interconnects through the dielectric layers are provided e.g., by copper traces, posts and vias, that provide low inductance interconnections to external contact pads (lands) for source, drain and gate connections. In some types of encapsulated packaging, the GaN die is embedded by overmolding or injection of a polymer dielectric material around the die and conductive interconnect materials. Alternatively, the dielectric body of laminated packaging for embedded GaN dies may be built up from layers of dielectric materials. This type of laminated packaging provides low parasitic inductance in a compact (i.e. small form factor) package, suitable for high voltage, high current GaN e-HEMTs.

The dielectric polymer resin composition forming laminated packaging may include laminate sheets and layers of composite material referred to as prepreg, which is a substrate material, such as woven or non-woven glass-fiber cloth, that is pre-impregnated with one or more polymer materials, such as a dielectric epoxy composition. The dielectric epoxy composition may comprise an epoxy resin, curing agents, additives, such as fire retardants, and fillers and other substances to modify properties of the resulting composite material. One or more pre-cured epoxy laminate sheets and/or uncured prepreg layers are cut to form a cavity for the semiconductor die, and sandwiched between other uncured prepreg layers, i.e. assembled as a layer stack (i.e. layup), and the layers are then bonded together in a press, e.g. in a curing process using heat and pressure, to form a laminated dielectric body of the package in which the semiconductor die is embedded.

For power semiconductor devices, a typical embedded die package comprises low inductance electrical interconnect layers and conductive vias, e.g. formed from plated copper, and a thermal pad, also formed from plated copper. The outer layers of an embedded package comprise an isolation layer of solder resist (solder mask) which is a coating of a material that provides an electrically insulating and protective outer covering over the underlying dielectric and conductive layers, e.g. the solder resist layers cover the underlying layers including copper source, drain and gate interconnect traces, and openings are provided in the solder resist layer for the external source, drain and gate contact areas, and for the thermal pad.

GaN power switching devices, such as those mentioned above offered by GaN Systems Inc., which are embedded in a GaNPX type laminated package of small size, e.g. 7 mm×5 mm and 0.5 mm thick, are capable of operation at voltages in a range from 100V to 650V, for switching currents of tens or hundreds of Amps. Operating temperatures may reach or exceed 100 C. For small size dies having a high current capability per unit active area, and smaller package sizes, e.g. chip-scale packaging, package components are therefore subjected to higher electric fields and higher operating temperatures than for low voltage, lower power switching devices.

It is known that some dielectric materials are susceptible to degradation when subjected to high electric fields, especially at elevated operating temperatures. Reliability issues may be encountered with conventional solder resist layers, which provide the external dielectric coating and protective layer of the package, with openings for the contact pads and thermal pad.

Both the epoxy pre-preg materials and solder resist typically include fillers, such as dielectric particles of as silicon dioxide ($SiO_2$) or alumina ($Al_2O_3$), to provide a high dielectric strength. The core and pre-preg layers of an embedded package are stacked and pressed in a multi-layer press, at elevated temperature, and under vacuum (i.e. in a vacuum lamination process), which substantially eliminates risk of bubbles and voids, and provides a package body with planar front and back surfaces. On the other hand, solder resist is typically applied as a coating by screen-printing and is therefore susceptible to formation of bubbles or voids, which can lead to reliability issues. Multilayer screen printing, e.g. two layers of solder resist, is conventionally used to improve coverage and reduce issues with bubbles or voids. Nevertheless, a screen-printed coating of solder resist is conformal, and regions where the solder resist extends over edges or corners or underlying metal interconnect may be more susceptible to mechanical, thermal, and electrical stress and damage, leading to reliability issues.

This type of reliability issue with solder resist layers presents a particular challenge for embedded packaging of high voltage/high current lateral GaN e-HEMT power switches, that operate at high voltages and high temperatures, where high voltages combined with small geometry dies and packages result in package components being subject to higher electric fields and more extreme thermal cycling.

There is a need for improved or alternative embedded die packaging, particularly for high voltage/high current power semiconductor devices, such as GaN HEMTs, e.g., to provide improved reliability for high voltage and high temperature operation.

SUMMARY OF INVENTION

The present invention seeks to provides improved or alternative embedded die packaging for power semiconductor devices, and particularly for high voltage/high current wide-bandgap semiconductor power devices, e.g. GaN HEMTs and SiC power MOSFETS, which mitigate or circumvent at least one of the above-mentioned issues.

One aspect of the invention provides embedded die package comprising a power semiconductor device embedded in a package body, the power semiconductor device having external contact areas on at least one side of the package body, and an external dielectric coating, comprising a solder resist layer or other dielectric layer, on said at least one side of the package body, wherein the external dielectric coating is patterned without inside corners.

For example, the solder resist does not extend around or between said external contact areas. The external contact areas may comprise electrical contact pads and/or a thermal pad, on one or both sides of the package body.

Another aspect of the invention provides an embedded die package comprising an embedded die package comprising a power semiconductor device embedded in a package body, the power semiconductor device having external contact areas provided on at least one side of the package body, and an external dielectric coating, comprising a solder resist layer or other dielectric layer, on said at least one side of the body laminated body, wherein the external dielectric coating is patterned to avoid inside corners.

For example, the external dielectric coating does not extend over areas around and between the contact areas, or the external dielectric coating is removed from areas around and between contact areas, to avoid inside corners.

In some embodiments, the external dielectric coating is patterned to have outside corners only. In some embodiments the external dielectric layer is patterned to minimize inside corners, and in areas where inside corners are unavoidable, said inside corners are radiused. For example, inside corners may be unavoidable where contact pads are solder resist defined contact pads.

Contact areas may comprise electrical contact areas or contact pads, or thermal contact areas or thermal pads.

Where inside corners are unavoidable, it is preferable that contact areas are provided with rounded corners, e.g. rectangular contact pads have rounded corners. For example, the contact areas have rounded or chamfered corners, and where the external dielectric coating extends around or between said contact areas to form an inside corner, the inside corners of the dielectric coating are radiused to reduce stress.

Embedded die packaging of example embodiments is demonstrated to be resistant to solder resist crack initiation and propagation during extended thermal cycling.

For example, an embedded die package for automotive applications may comprise an embedded die package comprising a power semiconductor device embedded in a package body, the power semiconductor device having external contact areas provided on at least one side of the package body, and an external dielectric coating, comprising a solder resist layer or other dielectric layer, on said at least one side of the body laminated body, wherein the external dielectric coating has a stress reduction pattern wherein any inside corners are radiused to reduce stress during thermal cycling avoid visible cracking and meet automotive standards.

Thus, embodiments of the invention provide for improvements in embedded die packaging for power semiconductor devices, and particularly for high voltage and high current power switching devices, e.g. comprising GaN HEMTs, SiC MOSFETs and Si IGBTs, which operate at elevated temperatures, e.g. for improved device performance and reliability.

The foregoing and other features, aspects and advantages of the present invention will become more apparent from the following detailed description, taken in conjunction with the accompanying drawings, of example embodiments of the invention, which description is by way of example only.

DETAILED DESCRIPTION

Figure 1:
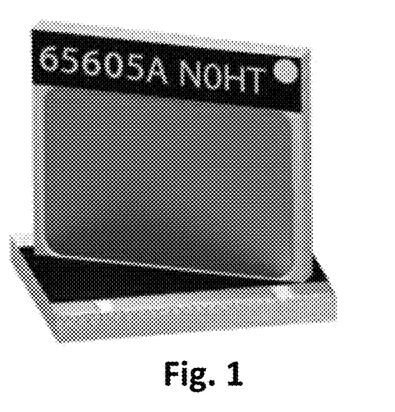
FIG. 1 is a photograph showing top and bottom surfaces of an embedded die package comprising a lateral GaN power transistor of an example embodiment.
Figure 2:
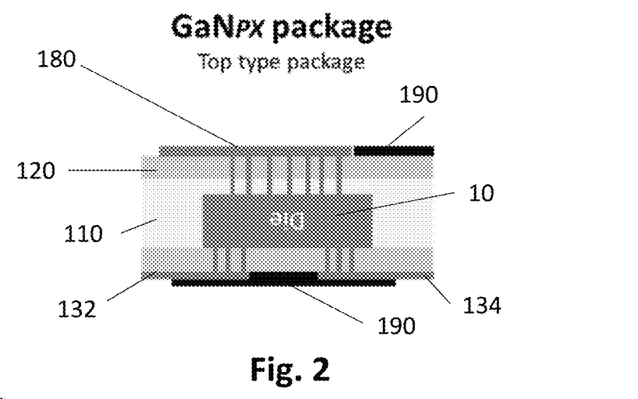
FIG. 2 shows a schematic cross-sectional view of an embedded die package comprising a power semiconductor die.

FIG. 1 shows a photograph of front and back surfaces (top and bottom sides) of an embedded die package comprising a power semiconductor device of an example embodiment comprising a 650V GaN HEMT in a GaNPx™ type package. The front (top) side of the package comprises a thermal pad. Source, drain, and gate pads are provided on a backside of the package. FIG. 2 shows a schematic cross-sectional diagram to show layers of the package structure, wherein a die 10 is sandwiched within a laminated package body comprising a laminated dielectric core 110 and layers of prepreg 120. The backside of the die 10 is connected to the thermal pad 180 by thermal vias 170. Source contacts and drain contacts on the front side of the die are connected, respectively, to a source pad 132 and a drain pad 134, by conductive vias. For example, the source pad and drain pad, and gate pad may comprise parts of a copper redistribution layer (Cu RDL) which are interconnected to underlying metallization with copper vias. The thermal pad and thermal vias may also comprise copper. The external surfaces of the embedded die package comprise a layer of solder resist 190.

Figure 3:
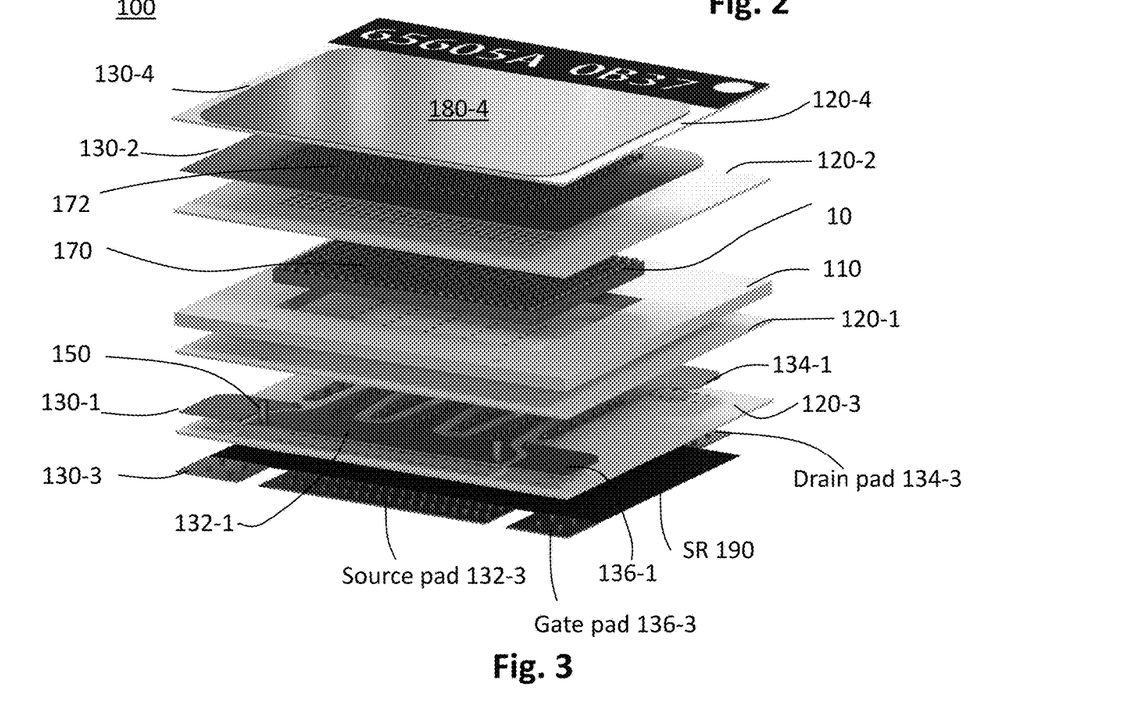
FIG. 3 shows an exploded view of components of an embedded die package such as shown in FIG. 1.

FIG. 3 shows a schematic exploded view of components of the embedded die package 100 of the example embodiment, in which source, drain and gate pads are provided on one side of the package body and the thermal pad is on the opposite side. Corresponding elements of the package of this embodiment are labelled with the same reference numerals as the package of the embodiment illustrated schematically in FIG. 2. The structure shown in FIG. 3 provides a schematic representation of the layer structure and relative dimensions of the elements of an embedded die package comprising the 650V GaN HEMT. In this view, the GaN die is oriented back-side up, and thermal vias 170 and 172 provide thermal contact with the thermal pad which is formed from metal layers 130-2 and 130-3. As illustrated, the fourth (top) metal layer 130-4 provides a large area thermal pad 180-4 on the top of the package. The first conductive layer 130-1 is patterned to provide source, drain, and gate contact areas, 132-1, 134-1 and 136-1 respectively, with conductive micro-vias for connection to respective source, drain and gate areas of the Cu RDL on the die. At the bottom, the third metal layer 130-3 is patterned to define external source pad 132-3, external gate pad 136-3 and external drain pad 134-3, which are also interconnected by conductive vias to respective source, drain and gate contact areas of the underlying interconnect metal. Conductive vias 150 provide for connection of the thermal pad to source. The solder resist 190 is a thin coating of screen-printed dielectric material, which also forms a protective external coating, e.g., to protect underlying layers against oxidation and during solder reflow.

In this description, references to "front-side" and "back-side" are with respect to the GaN die, wherein the substrate side of the die is the back-side and the active area of the lateral GaN transistor and its source, the drain and gate contacts are provided on the front-side of the die; and references to "top" and "bottom" are with respect to the package, as it would be mounted on a substrate, such as a support surface of a power module or PCB. For example, in the embedded die package of this example the external source, drain and gate pads are on the same surface (bottom) of the package that is to be mounted on the substrate surface. Customarily, this configuration may be referred to as having a bottom side thermal pad, and the terms "top" and "bottom" are not intended to limit the orientation of the package as it would be surface mounted for operation.

It will also be apparent that, for a specified operating voltage and operating temperature, in practice, the electric field experienced by the dielectric material of the package is dependent on, or influenced by, factors such as the size and geometry of the package body, and the size and layout of the die and conductive interconnect structure.

Since these embedded die packages are small in size, e.g. ~10 mm×~5 mm and about 0.5 mm thick, for packaging of power transistors, e.g. lateral GaN HEMTs rated for operation at high voltages, e.g. at 100V or 650V, the dielectric body of the package is subjected to high electric fields during operation, e.g. in a range of ~$10^3$V/cm to $10^5$V/cm.

Figure 4:
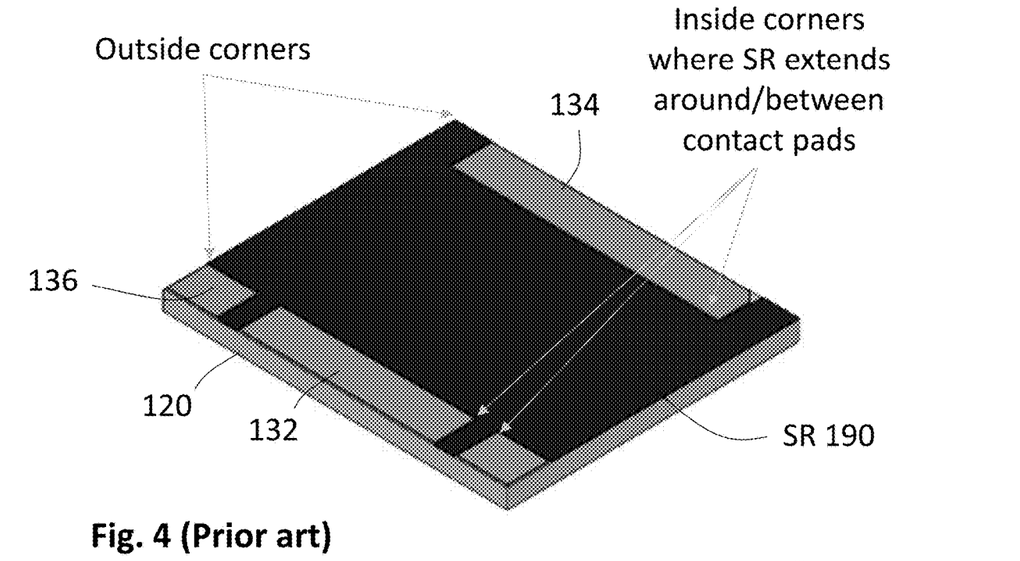
FIG. 4 (Prior Art) shows a top view of an embedded die package having a coating of solder resist of a conventional pattern, with openings for contact areas, wherein the solder resist coating extends around and between the contact areas, creating inside corners around the contact areas.

FIG. 4 (Prior Art) shows the back side of an embedded die package having a coating of solder resist 190 having a conventional layout or pattern in which the solder resist extends around the contact areas (pads) for the source 132, drain 134 and gate 136, with openings in the solder resist for the contact areas 132, 134 and 136. Although the solder resist coating is a dielectric, it is typically applied as a conformal coating by screen printing, which may result in bubbles or void. The conformal solder resist coating may be non-uniform, e.g. thinner over edges of conductive traces. As illustrated in FIG. 4, where the solder resist extends around and between contact areas, there are inside corners.

Figure 5:
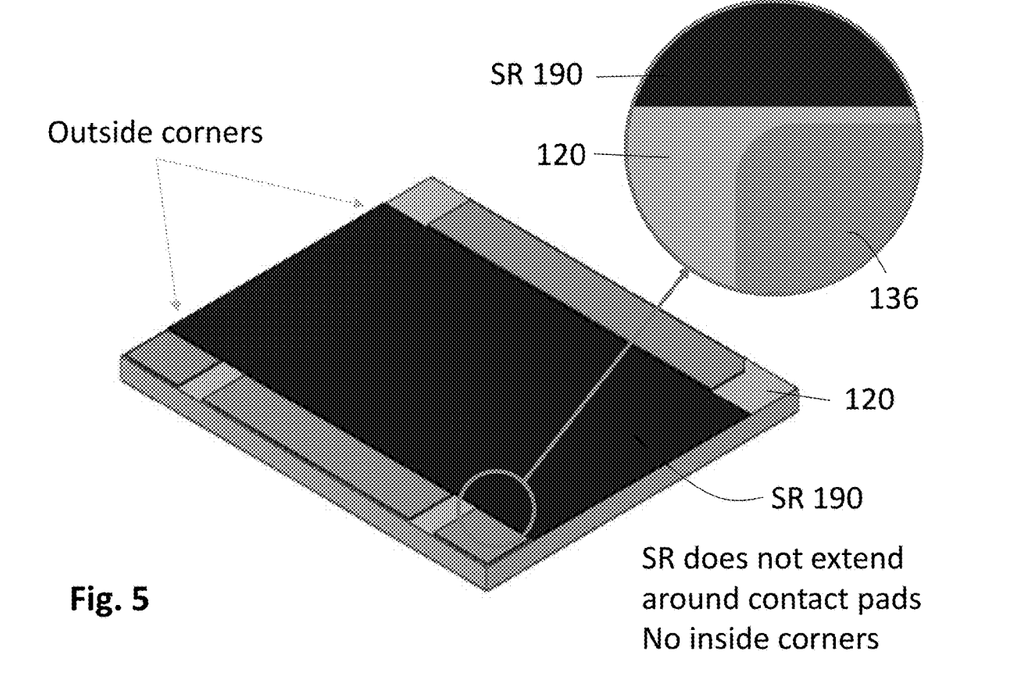
FIG. 5 shows a top view of an embedded die package of the example embodiment, comprising a coating of solder resist having a layout which is patterned to avoid inside corners.

FIG. 5 shows the back side of an embedded die package of the example embodiment shown in FIGS. 1 to 3, in which the layer of solder resist 190 does not extend between or around the contact pads, to avoid creating inside corners in the solder resist layer. As shown in the region in the enlarged view in FIG. 5, the solder resist 190 extends adjacent the gate contact pad 136 and dielectric layer 120 of the package body is exposed around the contact pad 136.

Figure 6:
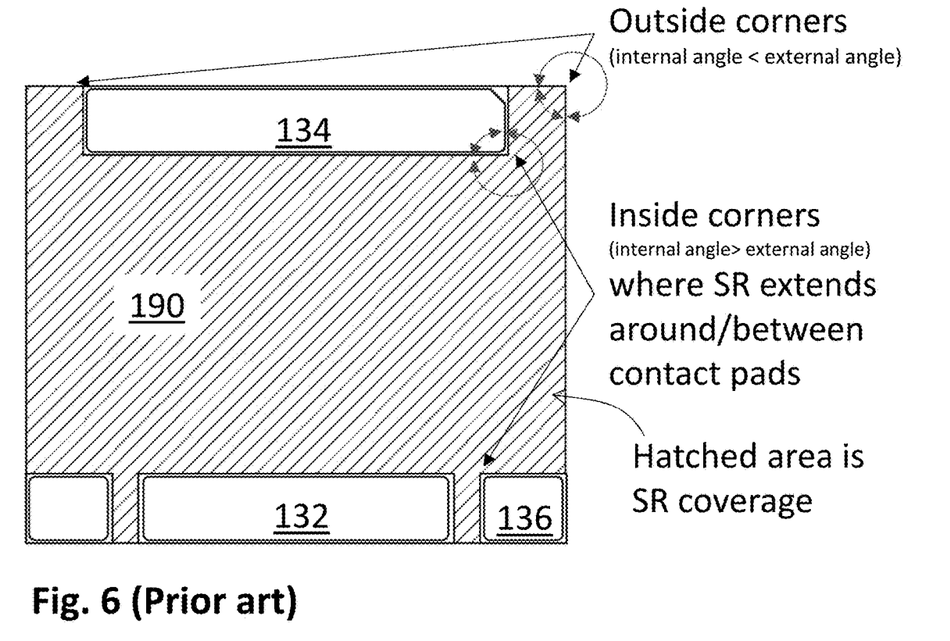
FIG. 6 (Prior Art) shows a schematic plan view of the embedded die package of FIG. 4 having a coating of solder resist of a conventional pattern, with openings for contact areas, wherein the solder resist coating extends around and between the contact areas, creating inside corners around the contact areas.

FIG. 6 (Prior Art) shows a schematic plan view of the back side of the embedded die package of FIG. 4, comprising a coating of solder resist 190 having a conventional layout or pattern in which the solder resist extends around the contact areas (pads) for the source 132, drain 134 and gate 136, with openings in the solder resist for the contact areas 132, 134 and 136. The solder resist coating has a concave polygon shape with inside corners where the solder resist extends around and between contact pads.

Figure 7:
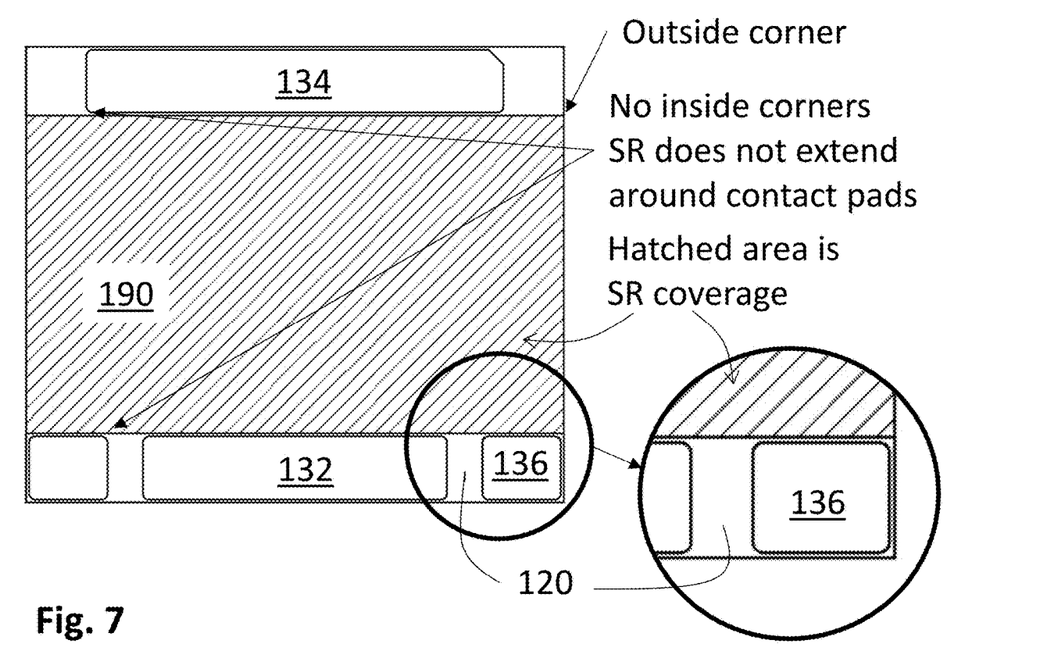
FIG. 7 shows a schematic plan view of an embedded die package of the example embodiment shown in FIG. 5, comprising a coating of solder resist having a layout which is patterned to avoid inside corners.

FIG. 7 shows a schematic plan view of the back side of an embedded die package of the example embodiment shown in FIG. 5, in which the layer of solder resist 190 does not extend between or around the source, drain and gate contact pads 132, 134 and 136, to avoid creating inside corners in the solder resist layer. As shown in the region in the enlarged view in FIG. 7, the solder resist 190 extends adjacent the gate contact pad 136 and dielectric layer 120 of the package body is exposed around the contact pad 136. The solder resist coating has a pattern which is simple convex polygon, with no inside corners.

Figure 8A:
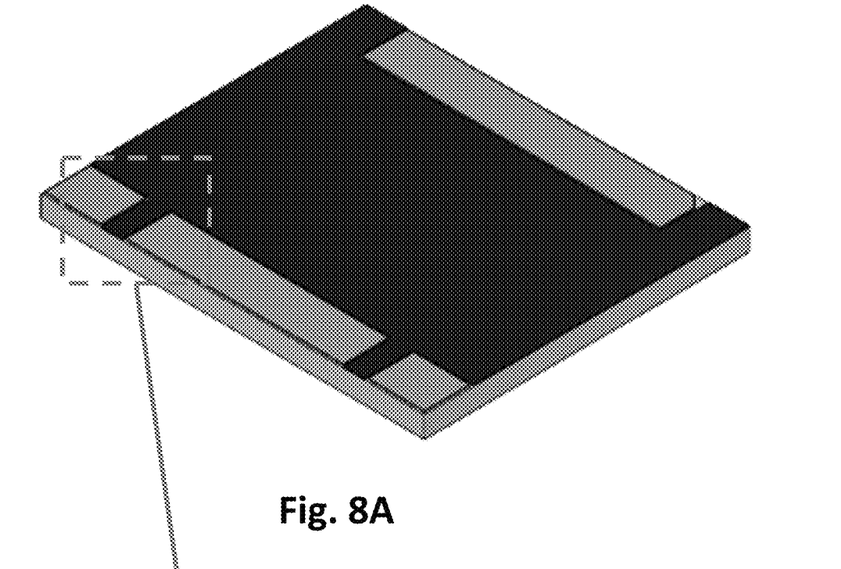
FIG. 8A shows an embedded package having a conventional solder resist layout and FIG. 8B shows a stress map for part of the layer of solder resist near an inside corner.
Figure 8B:
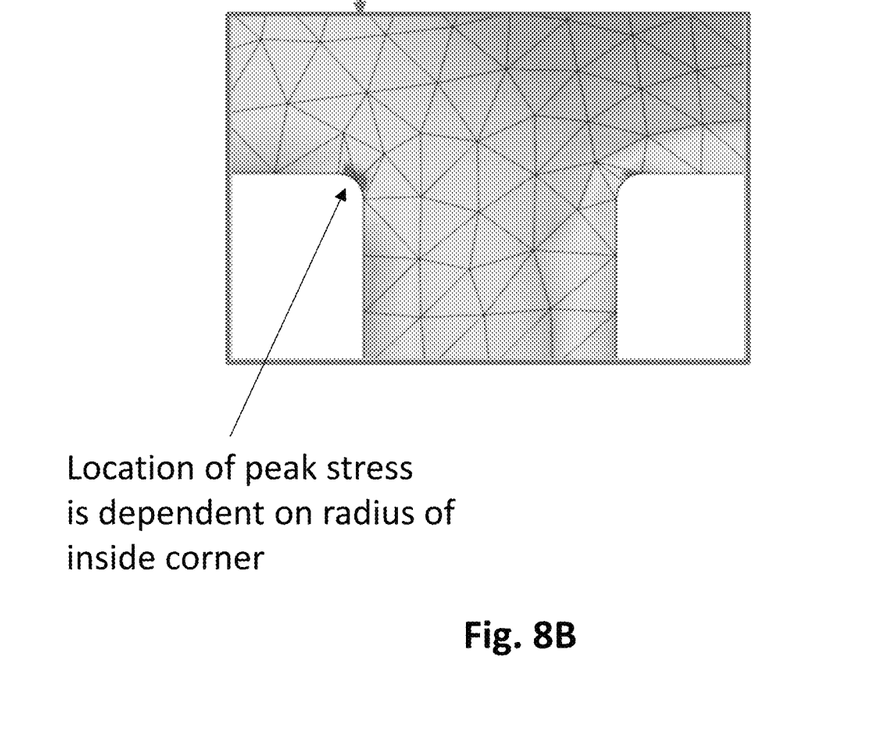
Figure 9:
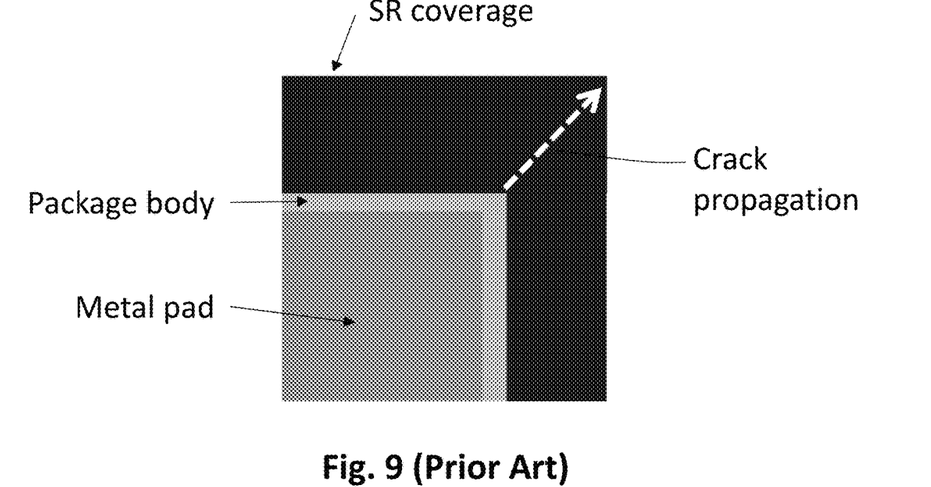
FIG. 9 (Prior Art) shows a schematic diagram of part of an embedded package structure to illustrate crack propagation from an inside corner after thermal cycling of an embedded die package having a conventional pattern of solder resist.

FIG. 8A shows an embedded package with a conventional solder resist pattern. FIG. 8B shows an enlarged view of a stress map of part of the solder resist in the region which extends between the source contact pad and the gate pad, to show a location of peak stress at the inside corner around the gate pad. FIG. 9 shows a schematic diagram of part of an embedded package comprising solder resist in the area of an inside corner, to illustrate schematically that that the inside corners near a contact pad, e.g. at the corner of a gate pad, may be a source of crack initiation in the solder resist layer, and during thermal cycling, a crack (indicated schematically by the dashed arrow) may propagate from these inside corners of the solder resist layer towards the centre of the package.

Figures 10, 11:
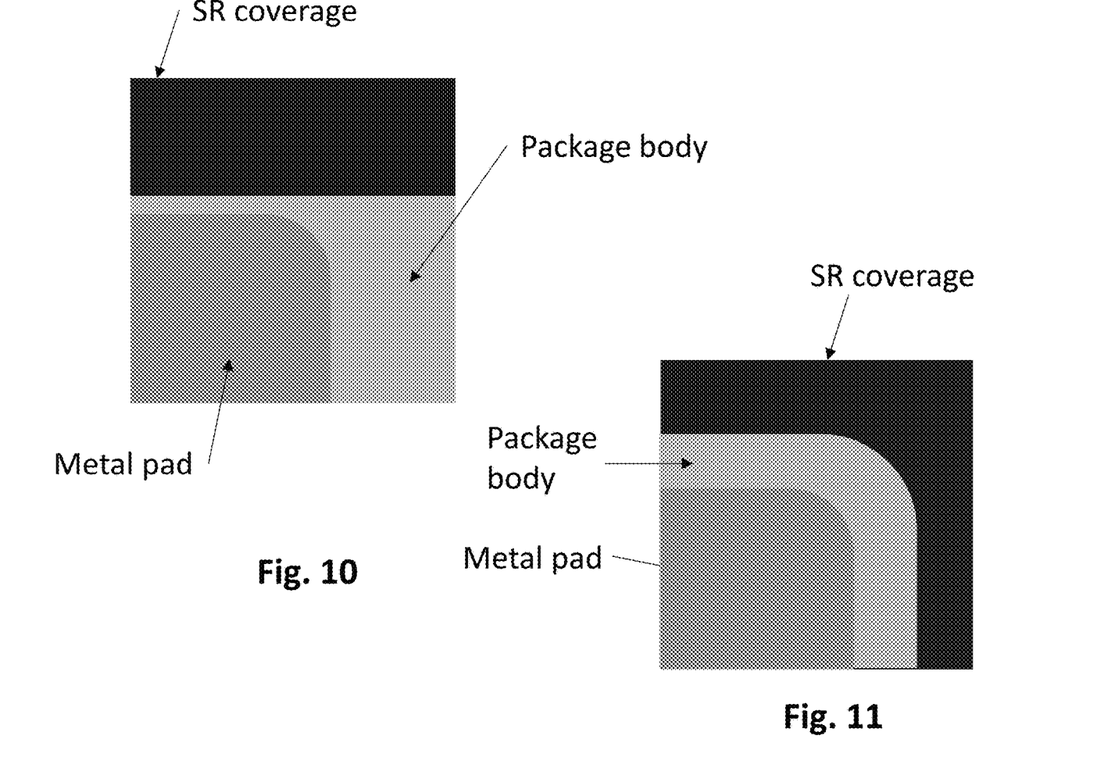
FIG. 10 shows a schematic diagram of part of an embedded package to illustrate crack-free solder resist after thermal cycling of an embedded die package having a pattern of solder resist of an embodiment which avoids inside corners.
FIG. 11 shows a schematic diagram of part of an embedded package to illustrate crack-free solder resist after thermal cycling of an embedded die package having a pattern of solder resist of an embodiment in which the contact pads are chamfered and inside corners of the solder resist coating are radiused to reduce peak stress in the solder resist coating.

FIG. 10 represents schematically part of a solder resist layout of an embodiment where the solder resist does not extend around or between contact areas, and thus avoids inside corners. It has been demonstrated by thermal cycling and analysis of lateral GaN power transistors in embedded die packaging of example embodiments having this solder resist layout, e.g. as illustrated in FIG. 1, that a solder resist layer patterned with no inside corners is resistant to initiation of cracks during thermal cycling.

FIG. 11 represents schematically part of a solder resist layout of another embodiment where an inside corner is required. In this structure, the corner of the contact pad is rounded or chamfered, and the inside corner of the solder resist is radiused to reduce stress in the solder resist. The solder resist is spaced from the contact metal, so a region of the dielectric of the package body is exposed. In variants of the structure shown in FIG. 11, e.g. if the contact pad is a solder resist defined contact pad, the solder resist abut or overlap the metal of the contact pad.

It is recognized that a coating of solder resist may be susceptible to cracking due to thermal cycling, which reduces long term reliability. For example, laminated FR4 dielectrics have an alpha-1 CTE value of ~15 ppm/C and copper is about 17 ppm/C, so the mechanical properties of these layers are well matched. By comparison, solder resist has a CTE of ~60 ppm/C. The high CTE and low strength of solder resist is a poor match to other materials of the package, so the solder resist has inferior mechanical properties and is a weaker part of the package. If a crack is formed in a region of high electric field, where the solder resist is acting as a dielectric, a short, breakdown, or burnout is possible. A process related bubble or void in a high electric field region of the solder resist may result in the same type of failure. When the solder resist coating cracks due to temperature cycling, with further temperature cycling a crack in the solder resist can propagate down into the layer stack, e.g. into the FR4 dielectric layers, eventually reaching the die or other internal conductive layers, resulting in an electrical breakdown. The solder resist in the region where the crack was initiated may be acting as a dielectric (i.e. in regions of high electric field) or other regions the solder resist may be acting primarily as a protective layer rather than a dielectric layer (e.g. in regions of low electric field). In the latter case, if the crack propagates through to other layers, an initial mechanical failure of the solder resist can lead to an eventual electrical failure.

Figure 12:
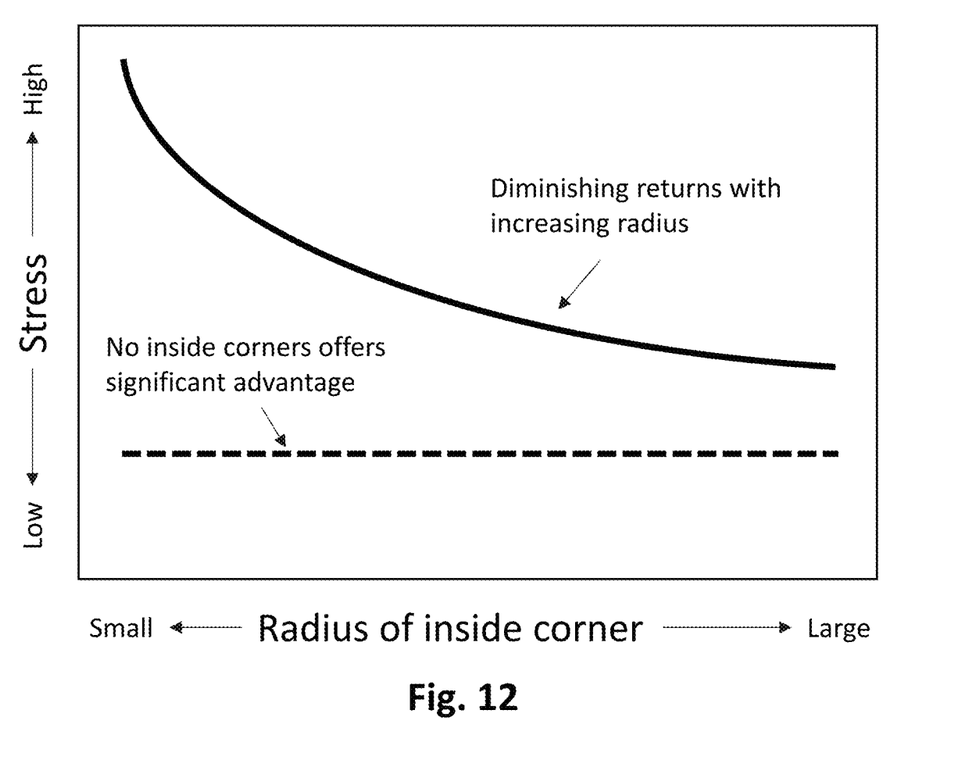
FIG. 12 shows a schematic plot of stress vs. radius of an inside corner in a layer of solder resist.

As illustrated in the schematic plot in FIG. 12, in the regions of inside corners of the solder resist layer, the stress is dependent on the radius of the inside corner. Increasing the radius of the inside corners reduces the peak stress, but there are diminishing returns for larger radii. In practice, the actual stress in the solder resist layer will depend on package dimensions, e.g. lateral dimension of the package body and contact pads, and power being dissipated by the power switching device in the package.

Figure 13:
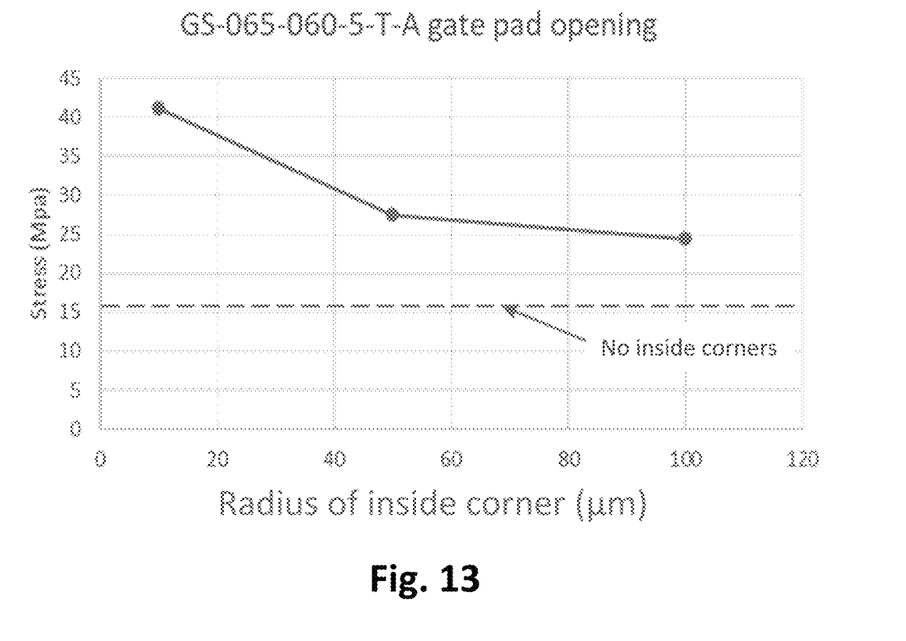
FIG. 13 shows a plot of stress vs. radius of an inside corner in a layer of solder resist for an embedded die package containing a lateral GaN power transistor of an example embodiment.

An example embedded die package comprising a lateral GaN power transistor (GaN Systems Inc. GS-0650-60-5T-A) is illustrated in FIG. 1. The GS-065-060-5-T-A is an Automotive-grade 650 V enhancement mode GaN-on-Silicon power transistor rated for a current of 60 A, in a top-side cooled embedded die package which offers low junction-to case thermal resistance. The package has lateral dimensions of 9 mm by 6.74 mm, and is 0.64 mm thick. The dimensions of the gate pads are 1.3 mm by 1.05 m. The source pad has dimensions of 5 mm by 1.05 mm. As illustrated by the data shown in FIG. 13 for an embedded die package of these dimensions, increasing the radius of inside corners of the solder resist layer, e.g. from 10 µm to 100 µm, reduces the peak stress, but there are diminishing returns for larger radii, e.g. greater than 50 µm. Reduced stress is achieved if the inside corners avoided altogether, e.g. by providing solder resist as illustrated schematically in FIG. 7, so that the solder resist does not extend around or between the metal contact areas. As illustrated in FIG. 7, the layout or pattern of the solder resist has no inside corners, only outside corners. As shown in FIG. 1 and FIG. 3, on the top side of the embedded die package, solder resist does not extend around the thermal pad, and is provided only along one edge of the package body to allow for package marking.

By way of example only, in the embedded package of the example embodiment, the solder resist may comprise, e.g. Taiyo PSR4000 D10ME, Taiyo AUS320 or other solder resists having similar properties. Other suitable dielectric materials, such as a prepreg layer or a layer of polyimide may be used instead of conventional solder resist to provide an external dielectric layer.

Embedded die packaging of an example embodiment has been described in detail, wherein the power semiconductor device comprises a GaN power switching device such as a high voltage, high current lateral GaN power transistor, e.g. a GaN HEMT, rated for high voltage and high current operation at an elevated temperature. Where the package comprises a layer of solder resist on one or both sides of the package body, the solder resist is patterned to avoid inside corners.

If a solder resist pattern comprising one or more inside corners is unavoidable, the inside corners are suitably radiused to reduce stress, e.g. ≥50 µm or ≥100 µm, depending on the dimensions of the package and the contact pads. For example, the latter may be required where contact pads are solder resist defined rather than metal defined, e.g solder mask defined pads (SMD) vs. non-solder mask defined pads (NSMD). It is also beneficial that the metal layer(s) defining the external contact areas are also radiused to avoid sharp corners. For example, the contact areas may be generally rectangular, with rounded corners. Structures with inside corners having smaller radiuses may be feasible if other dielectric materials are used instead of solder resist, e.g. dielectric materials having a CTE which is better matched to the underlying dielectric layers of the package body. For example, a polyimide (PI) coating may be more resistant to cracking than a conventional solder resist layer.

The unconventional solder resist patterning disclosed herein requires no change to the layer stack-up for embedded die packaging comprising a laminated package body. The improved solder resist pattern with no inside corners provides an effective solution to provide resistance to crack formation and propagation, e.g. so that embedded die packages for power semiconductor switching devices can meet pass criteria for all types of thermal testing and analysis, e.g. Temperature Cycling (TC), Thermal stress (TS) analysis, Intermittent Operating Lifetime (IOL) test, et al., such as required for automotive applications. Also, since solder resist is not provided in regions between or around contact pads, or is removed from these areas prior to assembly by surface mount technology (SMT), after SMT assembly there is more space between the part and the printed circuit board to facilitate flux cleaning of critical areas.

In other embodiments, the power semiconductor device may comprise a GaN power diode. While embodiments of embedded die packaging for a power semiconductor device are described in detail with refer to a power semiconductor device comprising a GaN power transistor, a power semiconductor device may comprise a GaN diode. The power semiconductor device may comprise a plurality of GaN power transistors, a plurality of GaN power diodes, a combination of at least one GaN power transistor and at least one power diode. For example, the die may comprise a power semiconductor device which comprises a plurality of GaN transistors configured as one of: a half-bridge, a full-bridge, and other switching topologies. The die may comprise other components, integrated with the power semiconductor device, e.g., one or more of: driver circuitry, control circuitry, sensors, passive components, et al. The power semiconductor device may be co-packaged and interconnected with other components, such as a driver chip, embedded in the package.

It is contemplated that in other example embodiments of embedded die packaging having a solder resist pattern as described herein may be more generally applicable to other types of semiconductor devices, which are subject to thermal cycling, where higher reliability embedded packaging is required.

For example, the power semiconductor device may comprise another type of power transistor, e.g. a SiC MOSFET or a Si IGBT, or another type of power diode. For example, the power semiconductor device may comprise at least one power transistor, at least one power diode, a combination of at least one power transistor and at least one power diode, fabricated using GaN technology or other III-Nitride technology, or Si technology or SiC technology or other Group IV semiconductor technology, or other semiconductor technology applicable to power semiconductor devices.

More generally, for example, the power semiconductor device may comprise one of: a power transistor, a power diode, and a combination of a power transistor and a power diode. The power semiconductor device may comprise one or a plurality of transistors, one or a plurality of diodes, a combination of at least one transistor and at least one diode. For example, the power semiconductor device may comprise a plurality of power transistor switches configured as a half bridge, full bridge, or other switching topology. The power transistor switches may be integrated on a single die, or configured by embedding multiple die in an embedded die package. A power semiconductor device such as a transistor device or power diode device, or power switching device, may comprise other components, e.g. integrated driver and/or control circuitry, sensors, and/or other active or passive components.

INDUSTRIAL APPLICABILITY

The improvements disclosed herein are designed to extend the lifetime of the packaging systems for embedded die packaging of power semiconductor devices, for example, to meet stress conditions specified for automotive qualification testing of discrete power semiconductor devices, e.g. AEC-Q101 and AutoQuall+™ (Enhanced-AEC-Q101). For example, the automotive semiconductor industry has strict thermal cycling test requirements that include no visible cracking, in addition to other electrical pass criteria. Embedded die packaging comprising a solder resist layout as disclosed herein assists in meeting these industry standards.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An embedded die package comprising a power semiconductor device embedded in a package body, the power semiconductor device having external contact areas on at least one side of the package body, and an external dielectric coating, comprising a solder resist layer or other dielectric layer, on said at least one side of the package body, wherein the external dielectric coating layer is patterned without inside corners.

2. The embedded die package of claim 1, wherein the external dielectric coating does not extend around or between said external contact areas.

3. The embedded die package of claim 1, wherein the external dielectric coating is removed from areas around and between contact areas, to eliminate inside corners.

4. The embedded die package of claim 1, wherein the external dielectric coating is patterned to have outside corners only.

5. The embedded die package of claim 1, wherein the package body comprises a laminated package body.

6. The embedded die package of claim 1, wherein said contact areas comprise any one of an electrical contact area and a thermal contact area.

7. The embedded die package of claim 1, wherein said contact areas have rounded or chamfered corners.

8. The embedded die package of claim 1, wherein said contact areas are rectangular with rounded corners.

9. An embedded die package comprising an embedded die package comprising a power semiconductor device embedded in a package body, the power semiconductor device having external contact areas provided on at least one side of the package body, and an external dielectric coating, comprising a solder resist layer or other dielectric layer, on said at least one side of the body laminated body, wherein the external dielectric coating is patterned to avoid inside corners.

10. The embedded die package of claim 9, wherein the external dielectric coating does not extend over areas of the package body around and between the contact areas.

11. The embedded die package of claim 9, wherein the external dielectric coating is removed from areas around and between contact areas, to eliminate inside corners.

12. The embedded die package of claim 9, wherein the external dielectric coating is patterned to have outside corners only.

13. The embedded die package of claim 9, wherein the package body comprises a laminated package body.

14. The embedded die package of claim 9, wherein the external dielectric coating is patterned to minimize inside corners, and in areas where inside corners are unavoidable, said inside corners are radiused.

15. The embedded die package of claim 9, wherein said contact areas comprise any one of an electrical contact area and a thermal contact area.

16. The embedded die package of claim 9, wherein said contact areas have rounded or chamfered corners.

17. The embedded die package of claim 9, wherein said contact areas are rectangular with rounded corners.

18. The embedded die package of claim 9, wherein any inside corners of the external dielectric coating are radiused to reduce stress.

19. The embedded die package of claim 9, wherein said contact areas have rounded or chamfered corners and where the external dielectric coating extends around or between said contact areas to form an inside corner, the inside corners are radiused to reduce stress.

* * * * *